US006828546B2

(12) United States Patent
Reime

(10) Patent No.: US 6,828,546 B2
(45) Date of Patent: Dec. 7, 2004

(54) OPTO-ELECTRONIC SWITCH WHICH EVALUATES CHANGES IN MOTION

(76) Inventor: Gerd Reime, Friedenstrasse 88, D-75328 Schömberg (DE)

( * ) Notice: Subject to any disclaimer, the term of this patent is extended or adjusted under 35 U.S.C. 154(b) by 171 days.

(21) Appl. No.: 10/181,035
(22) PCT Filed: Jan. 16, 2001
(86) PCT No.: PCT/EP01/00431
§ 371 (c)(1), (2), (4) Date: Jul. 12, 2002
(87) PCT Pub. No.: WO01/54276
PCT Pub. Date: Jul. 26, 2001

(65) Prior Publication Data
US 2003/0020004 A1 Jan. 30, 2003

(30) Foreign Application Priority Data
Jan. 18, 2000 (DE) .......................................... 100 01 955

(51) Int. Cl.[7] .............................................. H01J 40/14
(52) U.S. Cl. ...................................... 250/221; 345/175
(58) Field of Search .................. 250/221; 345/156–160, 345/175

(56) References Cited

U.S. PATENT DOCUMENTS

| 4,381,446 A | 4/1983 | Fukuyama et al. |
| 4,943,712 A | 7/1990 | Wilder |
| 5,103,085 A | 4/1992 | Zimmerman |
| 5,592,033 A | 1/1997 | Gold |
| 6,313,825 B1 * | 11/2001 | Gilbert ........................ 345/156 |

FOREIGN PATENT DOCUMENTS

| DE | 31 46 152 A1 | 6/1983 |
| DE | 35 24 492 A1 | 1/1987 |
| DE | 35 26 992 C2 | 2/1987 |
| DE | 42 07 772 C2 | 9/1993 |
| DE | 42 12 562 A1 | 10/1993 |
| DE | 199 14 114 A1 | 10/1999 |
| EP | 0 518 648 A2 | 12/1992 |
| EP | 0 551 240 A1 | 7/1993 |
| FR | 2 693 859 A1 | 1/1994 |
| WO | WO 86/01953 A1 | 3/1986 |
| WO | WO 95/01561 A1 | 1/1995 |

OTHER PUBLICATIONS

Matsuda Katsuya, "Optical Touch Switch", Patent Abstracts of Japan No. 08 273 503, vol. 1997, No. 02, filed Oct. 18, 1996.

(List continued on next page.)

*Primary Examiner*—Thanh X. Luu
(74) *Attorney, Agent, or Firm*—Venable LLP; Robert Kinberg; Jeffrey W. Gluck

(57) ABSTRACT

The inventive opto-electronic switch comprises a light-emitting element (1) and a receiving element (2) which outputs a first signal (U(t)) whose value changes according to the amount of light received. The emitting element (1) and the receiving element (2) are arranged in such a manner that the light emitted by the emitting element (1) is diffused or reflected by objects, which are located within a determined area, such that at least one portion of this diffused or reflected light reaches the receiving element (2). The first signal (U(t)) is fed to an evaluation unit in which a switching element (18) changes its switching state if the change of the amount of reflected or dispersed light received by the receiving element, which is caused by motion of the object, is located within the limits of a predetermined motion pattern that corresponds to a tapping of a defined area. The evaluation unit determines time-variable changes in motion and identifies a change in motion of the object as tapping.

25 Claims, 13 Drawing Sheets

OTHER PUBLICATIONS

Masanobu Kazunori, "Object Detector", Patent Abstracts of Japan No. 58 147 670, vol. 007, No. 266, (P–239), filed Sep. 2, 1983.

Koshimizu Atsushi, "Touch Switch Device", Patent Abstracts of Japan No. 08 096 677, vol. 007, No. 266, (P–239), filed Apr. 12, 1996.

Ito Masaru, "Touch Switch Device", Patent Abstracts of Japan No. 07 296 670, No. 03, filed Nov. 10, 1995.

Toshifumi Fukuyama, "Ways To Prevent Malfunction In Photoelectric Switches", Journal of Electronic Engineering, vol. 21:59–63, (1984).

Sako Michiya, "Comparator with Hysteresis," Patent Abstracts of Japan No. 01093915, vol. 13, No. 330, filed May 10, 1987.

* cited by examiner

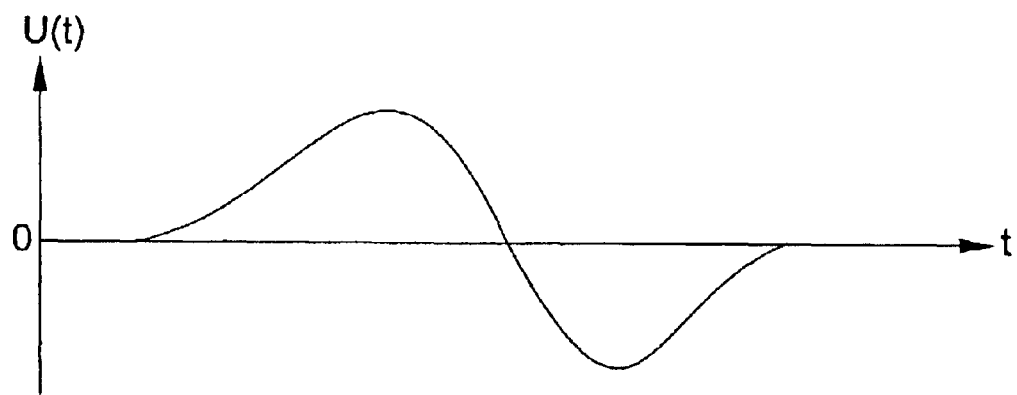
FIG. 3.1
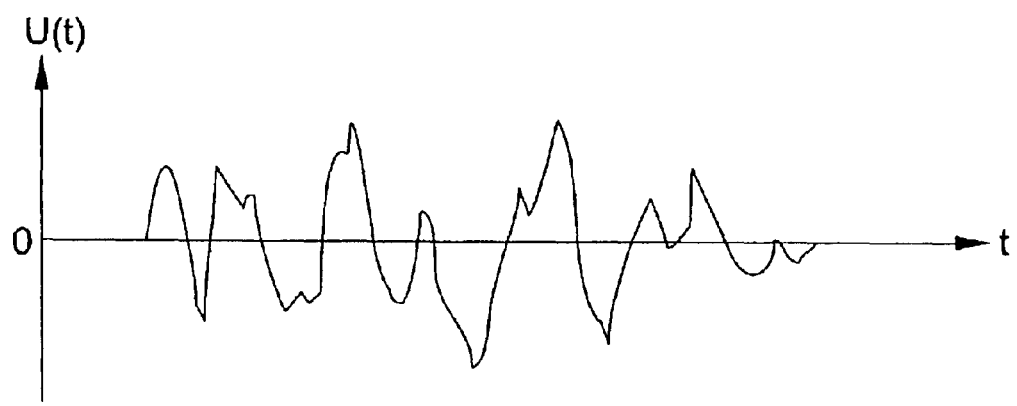
FIG. 3.2

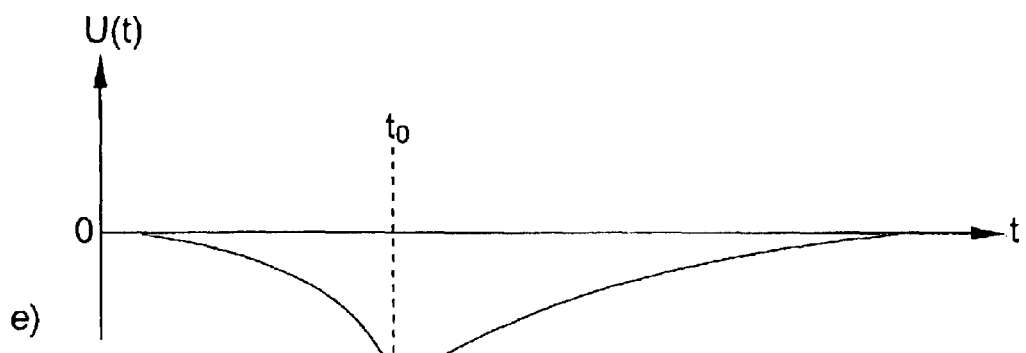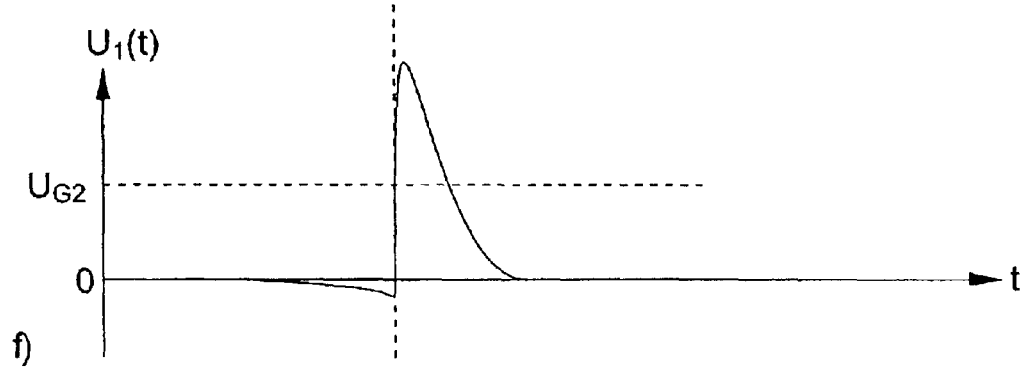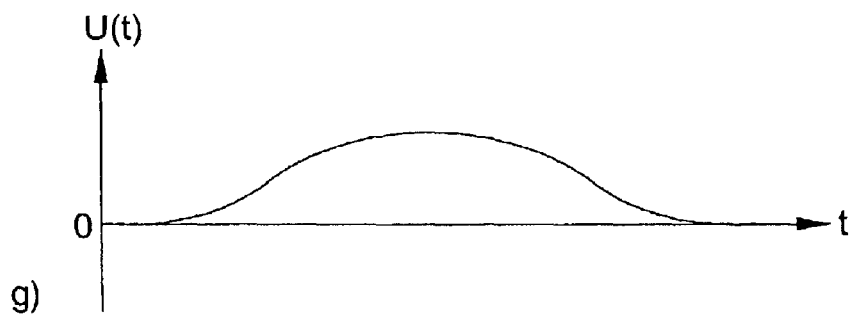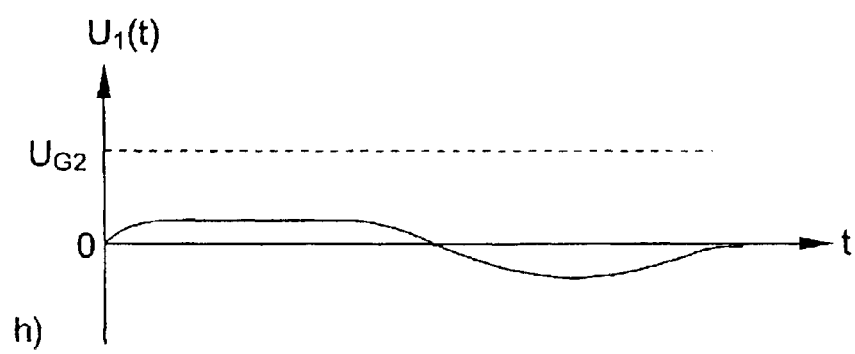
FIG. 4

OPTO-ELECTRONIC SWITCH WHICH EVALUATES CHANGES IN MOTION

REFERENCE TO RELATED APPLICATIONS

The present application claims priority of German patent application 100 01 955.2, filed on Jan. 18, 2000, the disclosure content of which is hereby expressly also made the object of the present application.

SCOPE OF THE INVENTION

The invention relates to an opto-electronic switch.

BACKGROUND TO THE INVENTION

In almost all electric or electronic devices, manual operation is effected by switches. These switches are almost always designed mechanically, two metal parts being brought into contact or respectively out of contact in order to close or respectively to open a circuit. However, this mechanical design has the disadvantage, amongst others, that it has mechanical wearing parts and consequently only has a limited service life and is fundamentally water-sensitive such that, where required, a costly casing is necessary.

STATE OF THE ART

Optical switches are already known; however, up to now they have been extremely lavish and, consequently, expensive and do not yet have the required standard of operational reliability. However, in principle, optical switches have advantages, as they manage, generally speaking, without any moving mechanical parts and the switching process can be triggered by mere tapping or by contacting a control surface or simply through approximation to a sensor.

DE 42 07 772 makes known an opto-electronic switch, which, using a logic component, recognizes tapping as the displacement pattern and evaluates this as a switching pulse as long as the tapping, for example effected by a finger, lasts for a certain dwell time. This shall enable to distinguish especially between tapping and, for example, wiping over a ceramic hob. However, as the sensor switch does not recognize a change in dynamic movement, additional sensors are necessary as blocking sensors, which make the tapping of a finger distinguishable from larger objects and consequently have a negative influence on the cost and the size of the system.

DE 42 07 772 makes known an opto-electronic switch, which, using a logic component, recognizes tapping as the displacement pattern and evaluates this as a switching pulse as long as the tapping, for example effected by a finger, lasts for a certain dwell time. There must be a difference more especially between tapping and, for example, wiping over a ceramic hob. However, as the sensor switch does not recognize a change in dynamic movement, additional sensors are necessary as blocking sensors, which make the tapping of a finger distinguishable from larger objects and consequently have a negative influence on the cost and the size of the system.

U.S. Pat. No. 5,103,085 A makes known an opto-electronic switch, which, for example, is for recognizing the approximation of an object to the glass in a display window even in sunlight. If the sensor is covered statically for a time predetermined by a timer, a circuit for further actuation becomes connected. It is not possible with this to recognize a tapping process with the steps of approximation—dwelling for a short time—lifting. For this reason, other displacements can result in a triggering of the circuit.

WO-A 86/01953 also works to acquire a finger displacement with static signals. A threshold value is deposited in a sample and hold circuit. To keep this threshold value above the actual value, a slow time constant is used in such a manner that there is not sufficient dynamic range present—if any at all—to recognize sudden, time-variable displacements.

PATENT ABSTRACTS OF JAPAN vol. 007, No. 266 (P-239), 26$^{th}$ November 1983 and JP 58 147670 make known an opto-electronic detection circuit, where for elimination of the detection sensitivity, a single signal is taken apart and a portion of the signal is supplied in a time-delayed manner to a comparator. The DC signal is then differentiated. Here it is not a question of the acquisition and above all not of the evaluation of a typical signal curve for a switching displacement.

DE 31 46 152 A1 describes an opto-electronic keyboard, which reacts to changes in the flow of photons. The evaluation units, which are not described in more detail, measure the change in intensity, which is produced in the flow of photons when the key is actuated, and trigger a switching process when the threshold values are exceeded. To increase the operating reliability, the keys respond in a time-delayed manner and recesses are provided for operation. There is no acquisition of time-variable changes in displacement.

DE 35 24 492 makes known coupling opto-electronic control elements to a pair of photoconductors. The transmitting photoconductor and the receiving photoconductor terminate under a resilient control element in such a manner that when the control element is actuated, the conditions of reflectance change and are evaluated as deliberate actuation. There is no acquisition of time-variable changes in displacement or differentiation between deliberate and accidental actuations by interrogating a displacement pattern, which comprises several steps. A comparable device working with a photoconductor is known in FR 2 693 859 A1.

DE 35 26 992 C2 proposes opto-electronic switching elements preferably for a ceramic hob, whereby objects such as, for example, a cookbook, accidentally placed on the surface, are not to trigger a switching process. To this end, as a time-variable change in displacement cannot be detected, the dwell time of an object on the switching element is checked for a relatively long time of up to 10 seconds and a switching process is only triggered if the dwell time is less. This may still be applicable to ceramic hobs, as it takes a certain time to supply the heat, however a shorter reaction time is necessary for normal switches.

DE 42 12 565 A1 also makes known an encased, mechanically operating foil keyboard. Snap-type washers are provided as the actuating element.

OBJECT OF THE INVENTION

It is an object of the invention to create an improved opto-electronic switch, more especially an opto-electronic switch with a high degree of operational reliability.

SUMMARY OF THE INVENTION

These and other objects are achieved according to the invention by the provision of an opto-electronic switch including at least one light-emitting transmitting element having a radiation field, at least one receiving element for receiving light, the at least one receiving element outputting a first signal, a value of the first signal depending on the amount of light received, wherein the at least one light-emitting transmitting element and the at least one receiving element are disposed so that the light transmitted by the at least one light-emitting transmitting element is at least partially reflected by an object which is situated within a given region and which is spaced in a given manner from the at least one receiving element and transmitting element such that at least an amount of a reflected light reaches the at least one receiving element, and an evaluation unit for evaluating the first signal and including at least one switching element, wherein the evaluation unit determines a time-variable change in displacement of the object when the object is suddenly braked in a defined region, the time-variable change in displacement being a function of a change in the first signal, which change is caused by displacement of the object, the evaluation unit recognizing the time-variable displacement as tapping when the time-variable displacement is within a predetermined displacement pattern, and wherein the switching element changes from one switching state to another switching state if the displacement of the object creates an object displacement pattern lying within limits of the predetermined displacement pattern.

BRIEF DESCRIPTION OF THE DRAWINGS

The invention is now explained in more detail by way of an exemplified embodiment. In which:

FIG. 2b is a variation on the exemplified embodiment shown in FIG. 2a,

FIG. 3.1 is the curve of the measuring signal with coverage of the first sensor-active region, FIG. 3.2 is the curve of the useful signal if, for example, a cloth is moved rapidly to and fro on the glass plate.

DETAILED DESCRIPTION OF PREFERRED EXEMPLIFIED EMBODIMENTS

Figure 1:
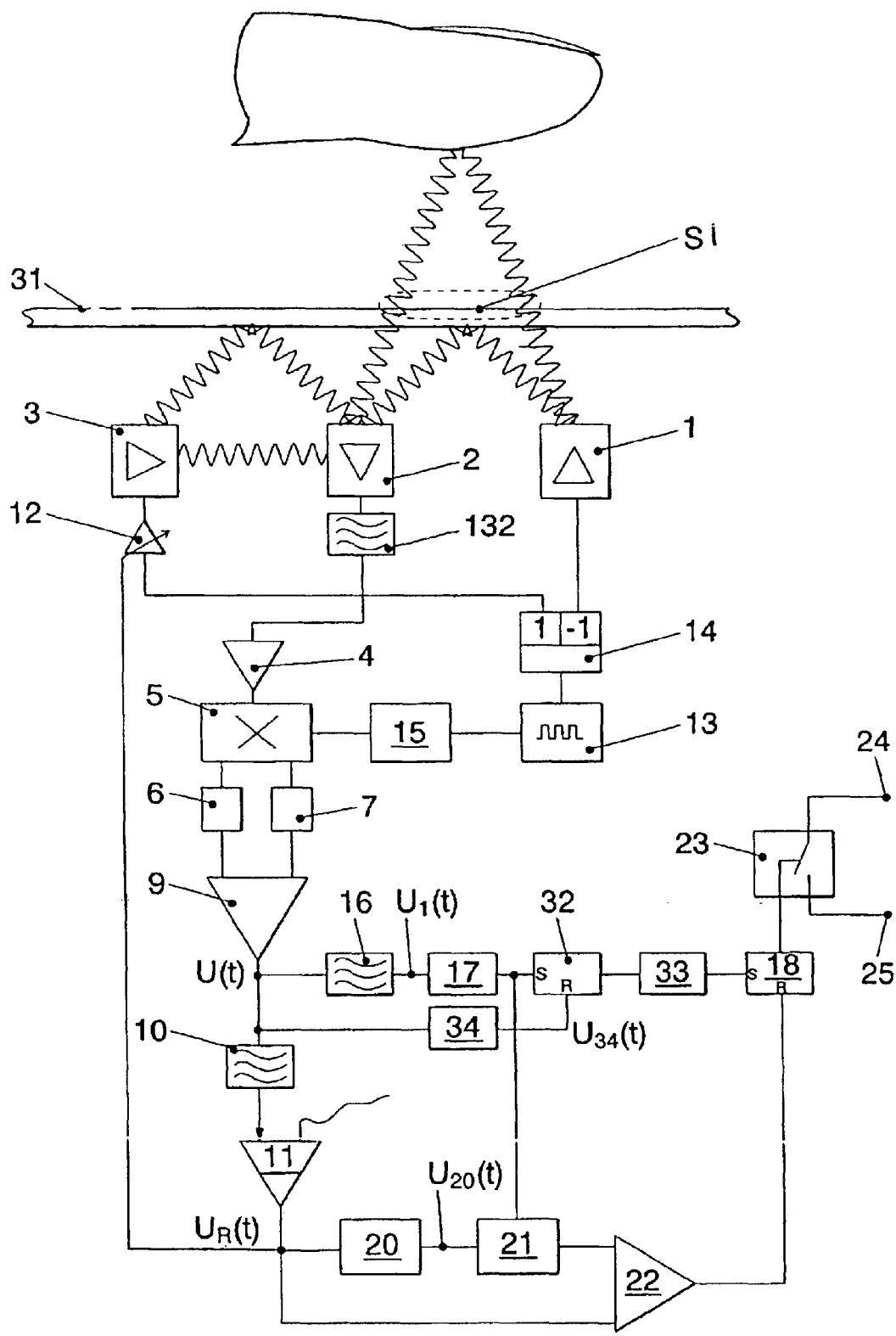
FIG. 1 is a first exemplified embodiment of an opto-electronic switch.

The invention is now described in more detail as an example with reference to the enclosed drawings. However, the exemplified embodiments are only examples, which are not to restrict the inventive concept to one certain arrangement.

The exemplified embodiments show various developments of an opto-electronic switch, which is equipped with at least one light-emitting transmitting element and at least one receiving element. The receiving element passes its signals, the value of which depends on the amount of light received, to an evaluation unit, in which at least one switching element changes its switching state if the value of the first signal or the value of another signal which is derived from this signal, exceeds or falls below predetermined limit values. Transmitting and receiving elements can be disposed in such a manner that the light coming from the transmitting element is diffused or reflected by objects, which are located within a certain region, or by a displaceable element, which is at a predetermined spacing from the receiving element and the transmitting element, such that at least one portion of this diffused or reflected light reaches the receiving element. Consequently, the change in the amount of reflected or diffused light, which is received by the receiving element, caused by a displacement of the object or by a displacement of the displaceable element, causes a change in state of the switching element if the displacement is inside the limits of a predetermined displacement pattern.

This displacement pattern is preferably a tapping of a defined region by finger, hand or another part of the body. For example, a defined region of a glass or plexiglass or of a photoconductor, which is coupled to the transmitting element and/or receiving element, can be tapped.

The addressed displaceable element can, for example, be a snap-type spring, as is sometimes used in standard switches. The evaluation unit either recognizes just the displacement pattern of this snap-type spring or in addition to the approximation of the object. For example, the snap-type spring can be situated on the approximation sensor so as to show the user the switching effect in a tactile manner, however just the displacement of the displaceable element can also be detected and evaluated. The snap-type spring is displaceable against a restoring force and can, for example, overcome a dead point when moving against the restoring force.

The evaluation unit determines time-variable changes in displacement, such as, more especially, the change in the speed of the object when there is sudden braking at the operator interface of the switch or of the displaceable element at the end of actuation by the user, and recognizes this change in displacement of the object or of the displaceable element actuated by the object as tapping. The displacement pattern is preferably the tapping of an operator interface of the opto-electronic switch or of the displaceable element by the object, a dwelling of the object for a predetermined dwell time as well as a raising of the object by more than a predetermined spacing from the operator interface.

One transmitting element and one receiving element are referred to predominantly in the exemplified embodiments of the invention. However, it is to be appreciated by one skilled in the art that it is possible to provide a plurality of individual elements or a plurality of elements working in parallel. Transmitting element and receiving element—regardless of how many are working together—form at least one sensor unit, which preferably detects the entire displacement pattern alone with the aid of the evaluation unit. Additional sensor units as blocking means, which as additional auxiliary means are to distinguish between deliberate and accidental changes in displacement such as, for example, placing a pan on the hob and wiping it over, are not necessary.

First Exemplified Embodiment

Figure 10:
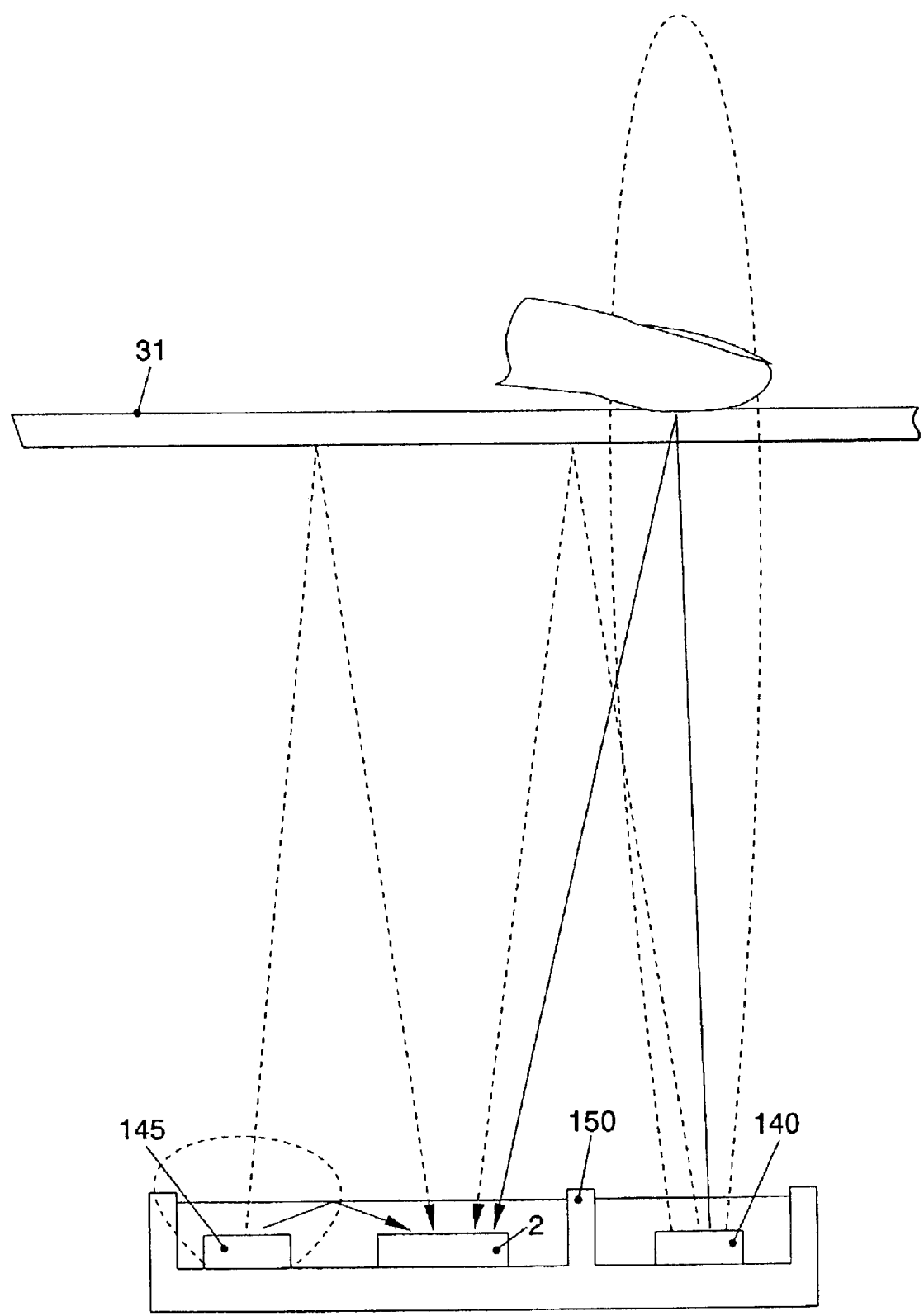
FIGS. 10, 11 are arrangements to create asymmetry between the transmitting elements.
Figure 11:
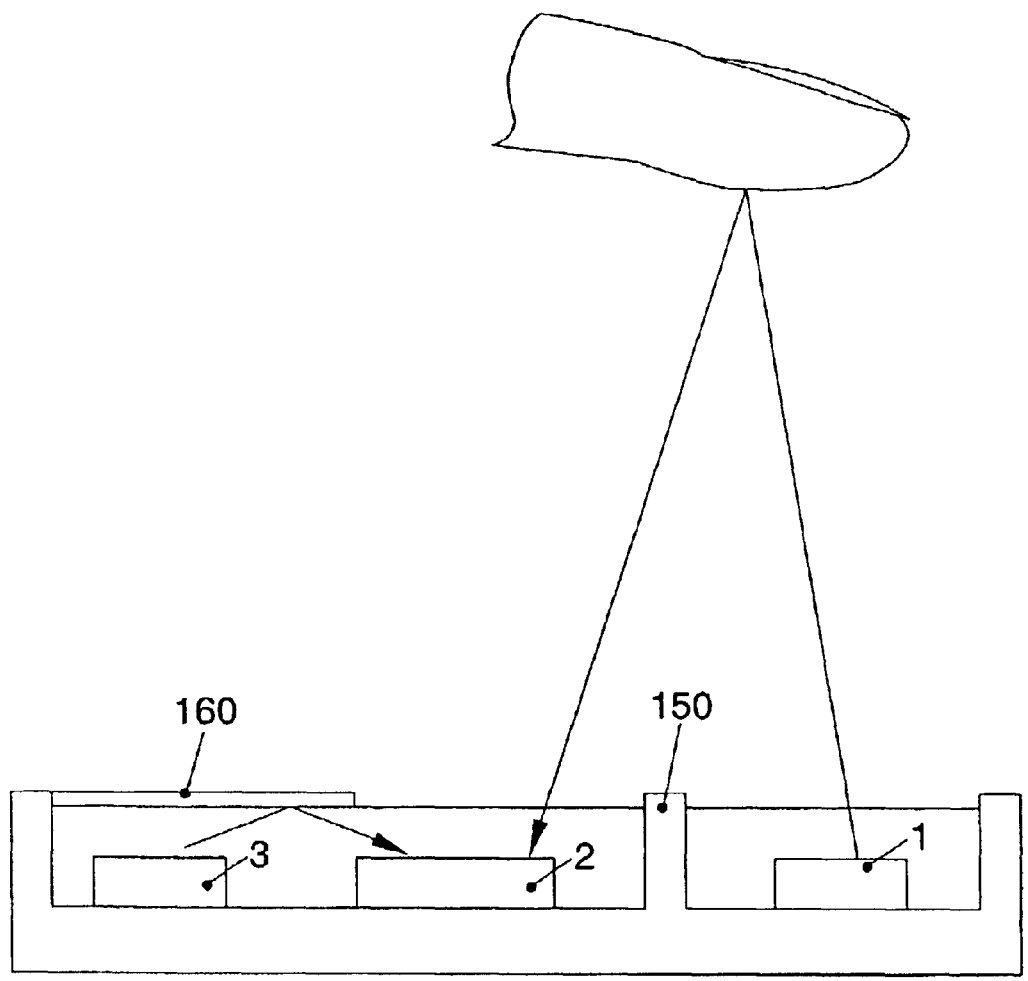

FIG. 1 represents a first exemplified embodiment of an opto-electronic switch. Under a glass plate 31 are disposed at least two light-emitting diodes 1, 3 as transmitting elements, the light of which can be reflected at least partially at the glass plate 31 as the transmission element, and also may penetrate this latter and after reflection or respectively diffusion may partially strike the photodiode 2. In the present example, the light of the first light-emitting diode 1 is reflected at a finger. A correspondingly set-up light-emitting diode can also act as photodiode. The glass plate or another surface should be translucent to light at least in a certain wavelength range. The light emitted from the light-emitting diode 3 does not act as a measuring section, but is only required to compensate for the external light. It is consequently conceivable and in many cases expedient to block the light path of this light-emitting diode to the effect that it cannot penetrate to the outside. An arrangement for blocking one of the two beams of light is represented in FIG. 11. It is also conceivable to configure the first light-emitting diode as a light-emitting diode with light output beamed in the forward direction, such as, for example, long range emitting laser diodes, and to configure the second light-emitting diode as a light-emitting diode, which only emits in the short range (FIG. 10).

The light of the light-emitting diode 1 is only partially reflected at the glass plate 31 and the remainder consequently passes to the outside, it being reflected, in its turn, by an object, in this case a finger, and consequently being able to be diffused back partially into the photodiode 2. However, a displaceable element, such as for example a snap-type washer in accordance with the third exemplified embodiment, could be used in place of the object, if compensation for external light is required because the displaceable element, for example, is transparent in a certain wave range. The two light-emitting (diodes 1, 3 are supplied with voltage by means of a clock generator 13, the signal of one of the two light-emitting diodes being inverted. Where the light output of the light emitting diodes is even and where the reflection is precisely symmetrical or respectively where there is suitable regulation of the light brightness of at least one of the two light-emitting diodes (see below), there is a direct current voltage signal at the output of the photodiode 2, which direct voltage signal is supplied to a high-pass filter 132 to eliminate direct current voltage and low-frequency alternating-current portions. The high-pass filter 132, the cut-off frequency of which is below the frequency of the clock generator 13, only allows alternating-current portions through such that with the corresponding output performance of the light-emitting diodes 1, 3, the signal supplied to it becomes "0". Influences from external light sources are excluded with this arrangement.

This signal, filtered in this way, is supplied to an amplifier 4 and then to a synchronous demodulator 5. The synchronous demodulator 5 receives its clock signal from the frequency generator 13, this clock signal being delayed accordingly by the delay unit 15 for adaptation to the signal run times in the high-pass filter 132 and in the amplifier 4. The synchronous demodulator 5 divides the signal of the light sources 1 and 3, which is common to the signal path of the light receiver 2, to the high-pass filter 132 and to the amplifier 4, back into two separate paths. The signal sections cut out by the synchronous demodulator 5, are cleaned in the low pass filters 6 and 7 of nuisance spectral regions and are supplied to the comparator 9. In the case represented, the comparator 9 comprises a simple operation amplifier. The difference values corresponding to the light emitters are at the outputs of the respective low pass filters 6 and 7. In the correspondingly tuned state, that is two times the value zero. These two signals are supplied to the comparator 9. The voltage value U(t), the useful signal, is at the output of this comparator. This signal is also supplied to the signal centering level via a low pass filter 10.

The output of the signal centering level 11 is connected to a regulator 12, which controls at least the signal voltage for the light-emitting diode 3. The achievement of this arrangement is that the useful signal changes where there is a change in the reflection of the light beam emitted by the light-emitting diode 1, however is always constantly returned to zero value. The time constant for this resetting is determined in the exemplified embodiment by the low-pass filter 10.

Figure 4:
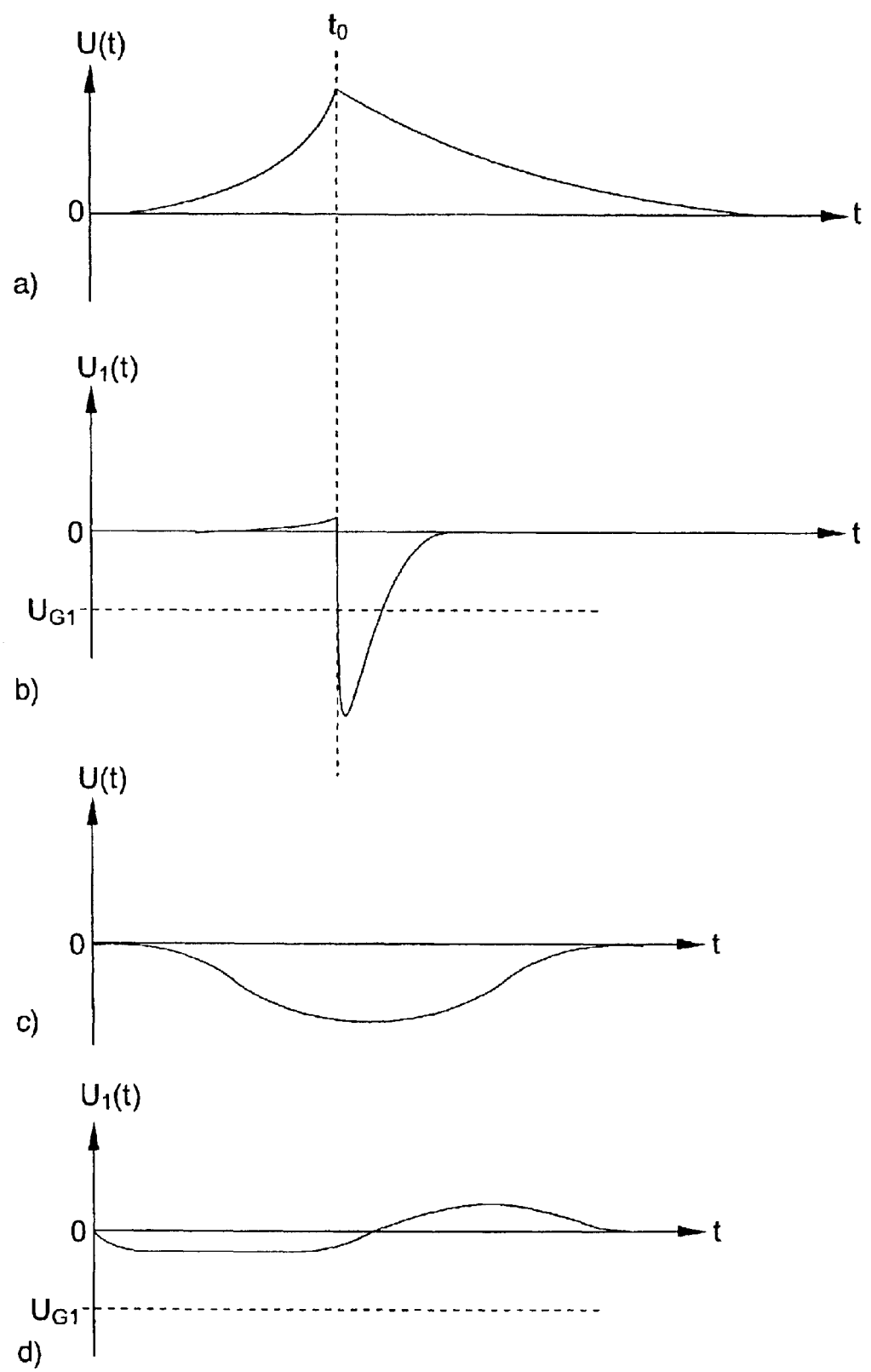
FIG. 4a is the curve of the useful signal U(t) when the first sensor-active region is tapped.
FIG. 4b is the curve of the differentiated displacement signal $U_1(t)$ when the first sensor-active region is tapped.
FIG. 4c is the curve of the useful signal U(t) when a finger is removed from the first sensor-active region.
FIG. 4d is the curve of the differentiated displacement signal $U_1(t)$ when a finger is removed from the first sensor-active region.
FIG. 4e is the curve of the useful signal U(t) when the second sensor-active region is tapped.
FIG. 4f is the curve of the differentiated displacement signal $U_1(t)$ when the second sensor-active region is tapped.
FIG. 4g is the curve of the useful signal U(t) when a finger is removed from the second sensor-active region.
FIG. 4h is the curve of the differentiated displacement signal $U_1(t)$ when a finger is removed from the second sensor-active region.

The arrangement described up to now is also known in WO 95/01561, the disclosure content of which is hereby also made into the object of the present application. It was proposed there more especially for detecting drops of water on the glass disc. In the present case, the useful signal U(t) is used to the effect that at least one sensor-active region S1 situated on the glass plate can be used as a control surface, that is that a tapping of this region triggers a switching process. This object can be achieved with the circuit described below:

The useful signal U(t) output by the above-described sensor arrangement is represented in various situations in FIGS. 3.1, 3.2 and 4. FIG. 4a records the useful signal U(t) when the sensor-active region S1 is tapped. A switching process is to be triggered by this type of signal. Useful signal curves are recorded in FIGS. 3.1 and respectively 3.2, as they occur with a single coverage of the first sensor-active region S1 or where the first sensor-active region S1 is wiped over, respectively. These types of signal curves are not to trigger any switching process. This goal is achieved with this exemplified embodiment as follows (FIG. 1):

The useful signal U(t) is supplied to the high-pass filter 16, which works here as differentiator, such that the value $U_1(t)$ of the differentiated displacement signal is situated at the output of the high-pass filter. Where an object, for example a finger, is displaced onto the sensor-active surface of the glass plate 31, the value U(t) of the useful signal increases slowly analogous to the displacement and stops suddenly, when the finger is braked on the glass plate 31, see FIG. 4a. If the finger remains and does not move, the value U(t) of the useful signal is regulated slowly back to $U_0$. The sudden change in value of the useful signal results at the output of the high-pass filter 16 in a jump in the value of the displacement signal $U_1(t)$, see FIG. 4b. This is detected by the threshold value switch 17 when a predetermined value $U_{G1}$ (negative in the example) is exceeded and the output of the first threshold switch 17, connected to the set-input of the first flip-flop 32, is set to active and consequently the first flip-flop 32 is set. The cut-off frequency of the high-pass filter 16 is selected such that a tapping at moderate speed still results in an easily detectable signal. The cut-off frequency could, for example, be in the range of 10 Hertz.

A signal created therefore from the useful signal is used in this case, namely the displacement signal obtained through differentiation, and this triggers a first process when its value $U_1(t)$ exceeds a certain limit value $U_{G1}$. Switching arrangements and cases of application are also conceivable, however, where the useful signal is used directly and triggers a process—change in flip-flop state—, when the value U(t) of the useful signal exceeds a certain value or falls below a certain value.

Figure 5:
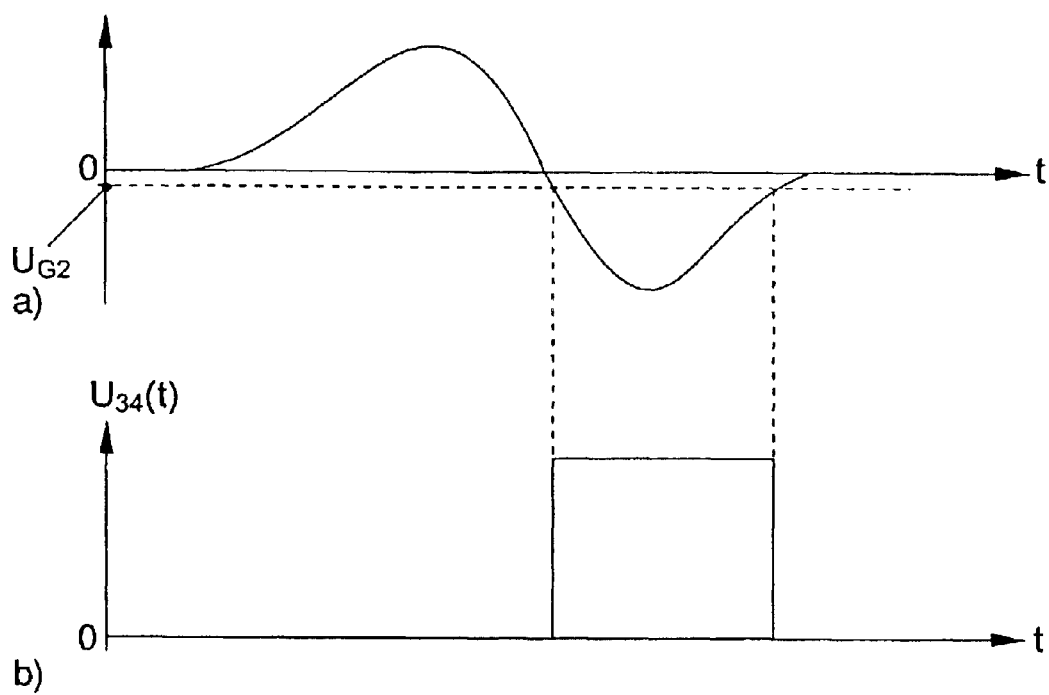
FIG. 5a is the curve of the measuring signal with coverage of the first sensor-active region.
FIG. 5b is the curve of the output signal of the first threshold value switch in the situation represented in FIG. 5a, FIG. 6 is the curve of the values $U_{20}(t)$, $U_R(t)$ as well as $U_R(t_0)$.

Every displacement, which is quick enough and covers the first sensor-active region, triggers this process, i.e. the output of the first flip-flop 32 is initially set to active. A wiping movement or similar is also sufficient to do this, but it is not, however, to be recognized as a deliberate switching process (see FIGS. 3.1 and 3.2) This why the useful signal is supplied to a second threshold switch 34, which becomes active when the value U(t) of the useful signal falls below a certain second threshold value $U_{G2}$. The fact that the removing of an object (removal of a finger) results in a reducing of U(t) in the opposite direction in comparison with the approximation is made use of here, in the example in the negative range (FIG. 3.1). Where the second threshold value $U_{G2}$ of the second threshold value switch 34 is exceeded in the negative direction, its output $U_{34}(t)$ is set to active (see FIG. 5).

Since the output of the threshold value switch 34 is connected to the reset-input of the flip-flop 32, setting this output to active will reset the flip-flop 32. Therefore, when there is a wiping or similar movement which has set the flip-flop to active, flip-flop 32 is reset to zero a short time later. The output signal of the flip-flop 32 is supplied to the time detection circuit 33. Time detection circuit 33 is set up such that its output is only set to active if the flip-flop 32 has been active longer than a predetermined time $\Delta t_1$, for example 100 ms. This predetermined first time slot $\Delta t_1$ corresponds substantially to the normal minimum dwell time of a finger, a hand or another part of the body when tapping a switch, which is configured as an electric switching element.

The output of the time detection circuit 33 is connected to the set-input of the second flip-flop 18. Where there is a deliberate tapping of the sensor-active surface, the output of the second flip-flop 18 is consequently set to active, as in this case the time between setting the first flip-flop 32 and resetting this flip-flop is greater than $\Delta t_1$, in other words: The finger remains longer than $\Delta t_1$ on the sensor-active region S1. However, where there are movements which are not to trigger any switching process—for example wiping over with a cloth—, the time between setting and resetting the first flip-flop 32 is smaller than $\Delta t_1$, such that these movements do not result in the second flip-flop being set. Therefore, by tapping the sensor-active surface, therefore, the state of the second flip-flop 18 is changed in a controlled manner. The output of the flip-flop 18 can also be connected to a switch 23, for example a relay.

The following displacement patterns are recognized by the evaluation unit: approximation of an object—sudden braking of the object—persistence of the object for a time slot, which exceeds a predetermined time slot. If this displacement pattern is recognized, the switching state of a switching element, in this case the second flip-flop 18, is changed.

A removal of the finger is not recognized by the threshold value switch 17, since the change in the value U(t) of the useful signal is effected in the other direction and after differentiation is too small (FIG. 4c) and consequently the value $U_1(t)$ of the displacement signal obtained through differentiation does not exceed the first limit value $U_{G1}$.

Figure 6:
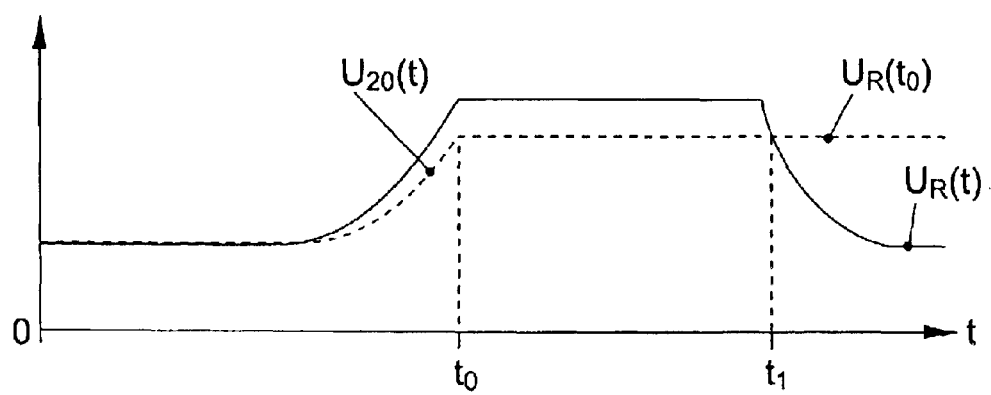

In many application cases it is desirable for the second flip-flop 18, which is set through the tapping of the sensor-active surface S1, to be reset again by targeted removal of the finger. This then produces the function of a key. However, it is advantageous when the clearing of the flip-flop 18 is not achieved until the finger has been removed a few millimeters from the glass plate 31, so as to prevent the flip-flop from being cleared inadvertently through a minimal displacement. This problem is solved as follows in the exemplified embodiment represented in this case:

The instantaneous value of the control signal $U_R(t)$, which is situated at the output of the signal centering level 11, is scanned and stored at a moment at which the approximating object is still situated just in front of the operator interface. To achieve this in the exemplified embodiment, this signal is supplied to the delay circuit 20. The voltage value $U_{20}$, which is situated at the output of the delay circuit 20, is stored in the memory 21 at the moment $t_0$ at which there is a signal situated at the output of the first threshold value switch 17, that is at the moment at which the first threshold value switch 17 has recognized the moment of the tapping. Alternatively, the signal located at the output of the signal centering level 11 can also be multiplied with a value smaller than 1 and this value stored. In both cases there is, consequently, a dependency on $U_R(t)$, such that the value stored in this way is neither dependent on the ageing-dependent state, for example, of the glass plate, on the temperature or other circumstances. The value $U_R(t_0)$, stored in this way, is supplied to a first input of the comparator 22. The control signal with the value $U_R(t)$ is located at the second input of the comparator. As long as the value of the control signal is above the value at the output of the memory 21, the comparator circuit 22 does not supply an output signal. However, if the value of the control signal at moment $t_1$ falls below the stored value, the output of the comparator circuit is set to active. The signals $U_{20}$, $U_R(t)$ and $U_R(t_0)$ are represented in FIG. 6. The second flip-flop 18 is reset with this signal.

It is also conceivable for not all threshold values, time constants etc of the components used to be fixed in an invariable manner, but to use components at least partially where the corresponding values can be changed from outside by means of a control input. Consequently, the displacement pattern to be recognized could be predetermined, where required, for example, by the software of an overall system in which the switch is installed.

The first exemplified embodiment has more especially the following advantages:

The position of the glass plate—one skilled in the art will recognize that a plate made of another material may be used here, the material simply has to be translucent for the spectral range selected—the light-emitting diodes serving as transmitting elements and the photodiode serving as receiving element can be freely selected within a wide region.

A scratching/contaminating of the glass plate is harmless as the static changes to the reflectance resulting therefrom are compensated by the system.

The arrangement is "blind" to external light such that the arrangement can be operated under external light conditions, which experience great changes.

Second Exemplified Embodiment

Figure 2A:
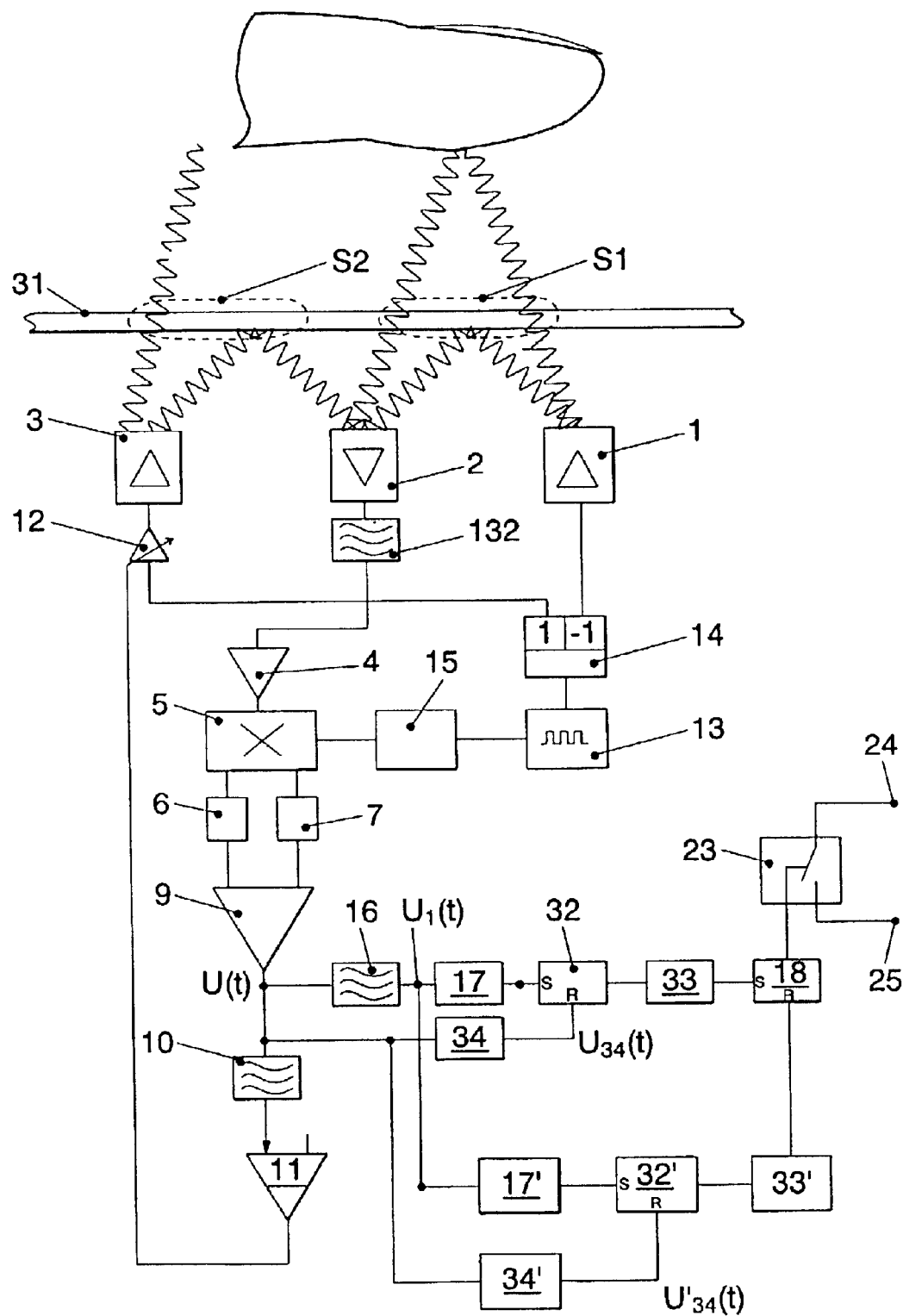
FIG. 2a is a second exemplified embodiment of an opto-electronic switch.

The second exemplified embodiment, represented in FIG. 2a, is similar to the first exemplified embodiment. The main difference is that the beam of light originating from the second light-emitting diode 3, is not only used for compensating external light, but also for preparing a second sensor-active region S2 on the glass plate. That means that the glass plate 31 is both in the radiation field of the first light-emitting diode and in the radiation field of the second light-emitting diode. The second sensor-active region S2 is used in this case to the effect that it is its tapping that resets the second flip-flop 18, not the removal of the finger from the first sensor-active region S1. Consequently, the function of a rocker-type switch is created, a tapping of the first sensor-active region S1 setting the first flip-flop 18, and consequently, for example, closing the switching element 23, and a tapping of the second sensor-active region S2 resetting the second flip-flop 18, and consequently, for example, re-opening the switching element 23. The method of functioning is as follows:

The above-mentioned details can be referred to with regard to the creation of the useful signal and the setting of the second flip-flop 18. The circuit arrangement and functioning of the same are identical to that of the first exemplified embodiment.

The following fact is made use of in what follows: when tapping the second sensor- active region S2, the signal curves of the useful signal U(t) and of the displacement signal $U_1(t)$ correspond to those when tapping the first sensor-active region S1, however are inverted relative to these. In FIGS. 4e and 4f, U(t) or respectively $U_1(t)$ are represented for a tapping of the finger on the second sensor-active region S2 and in FIGS. 4g and 4h, U(t) or respectively $U_1(t)$ are represented for the removal of a finger from the second sensor-active region S2.

The useful signal and the displacement signal are evaluated by means of the third threshold value switch 17', the fourth threshold value switch 34', the third flip-flop 32' and the second time detection circuit 33'. The evaluation corresponds to the evaluation of the signals, which are created when tapping the first sensor-active region S1, with the difference that: $U_{G1}'=-U_{G1}$, whereby $U_{G1}'$ is the limit value of the third threshold value switch 17' and $U_{G2}'=-U_{G2}$, whereby $U_{G2}'$ is the limit value of the fourth threshold value switch 34'. The output of the second time detection circuit 33' is connected to the reset-key of the second flip-flop 18, such that a tapping of the second sensor-active region S2 results in the resetting of this second flip-flop 18 and consequently in the opening of the switching element 23.

Figure 2B:
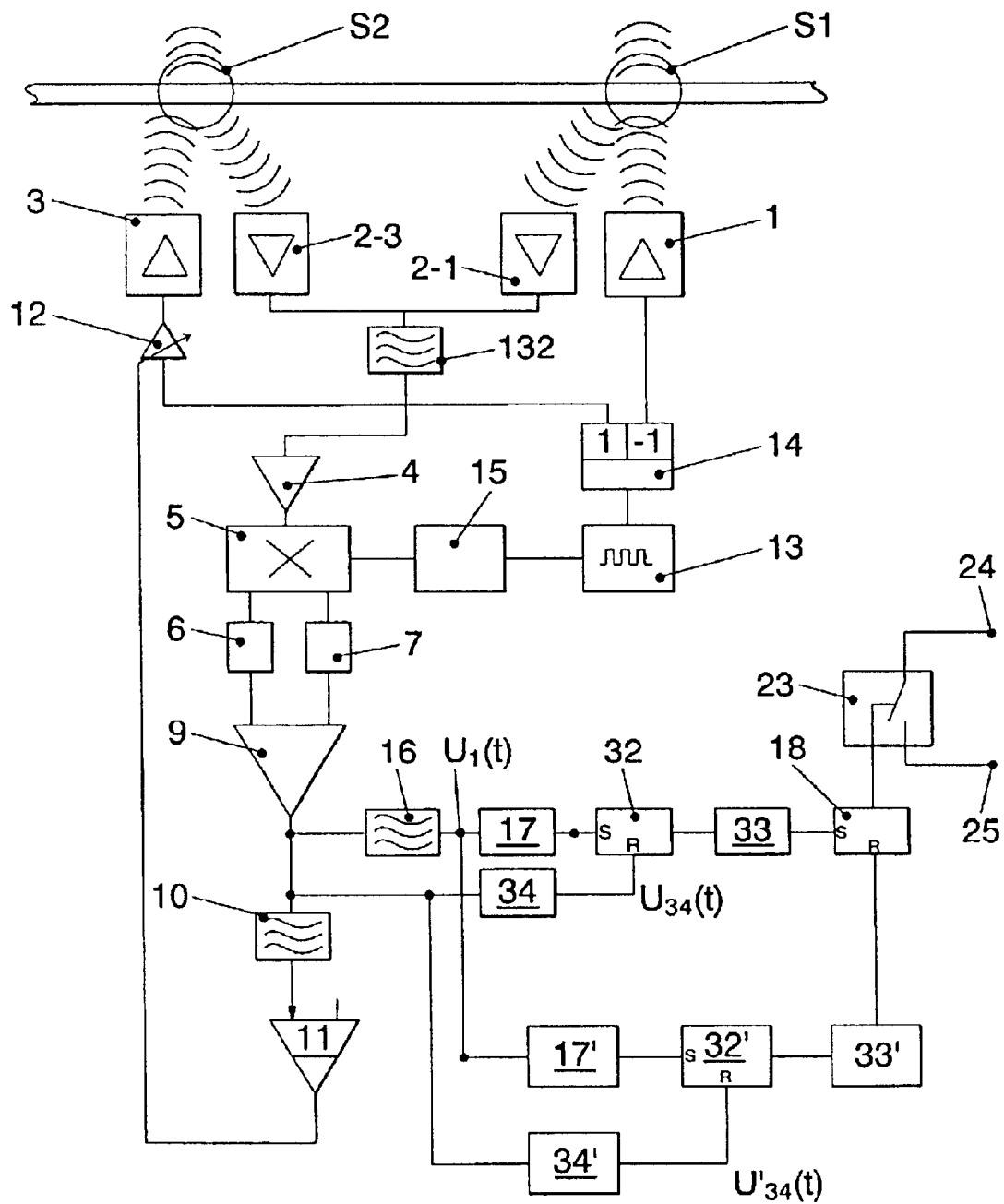

A variant on the second exemplified embodiment is represented in FIG. 2b. In this case an inherent photodiode 2-1 or respectively 2-3 is assigned to each light-emitting diode 1, 3. The two photodiodes 2-1 and 2-3 are connected in parallel and behave consequently as one single light-emitting diode for the evaluation unit. This variant offers the following advantages:

The two sensor-active regions S1 and S2 can be very easily and arbitrarily separated from one another.

Commercially obtainable light-emitting diode-photodiode units can be used.

Third Exemplified Embodiment

Figure 7A:
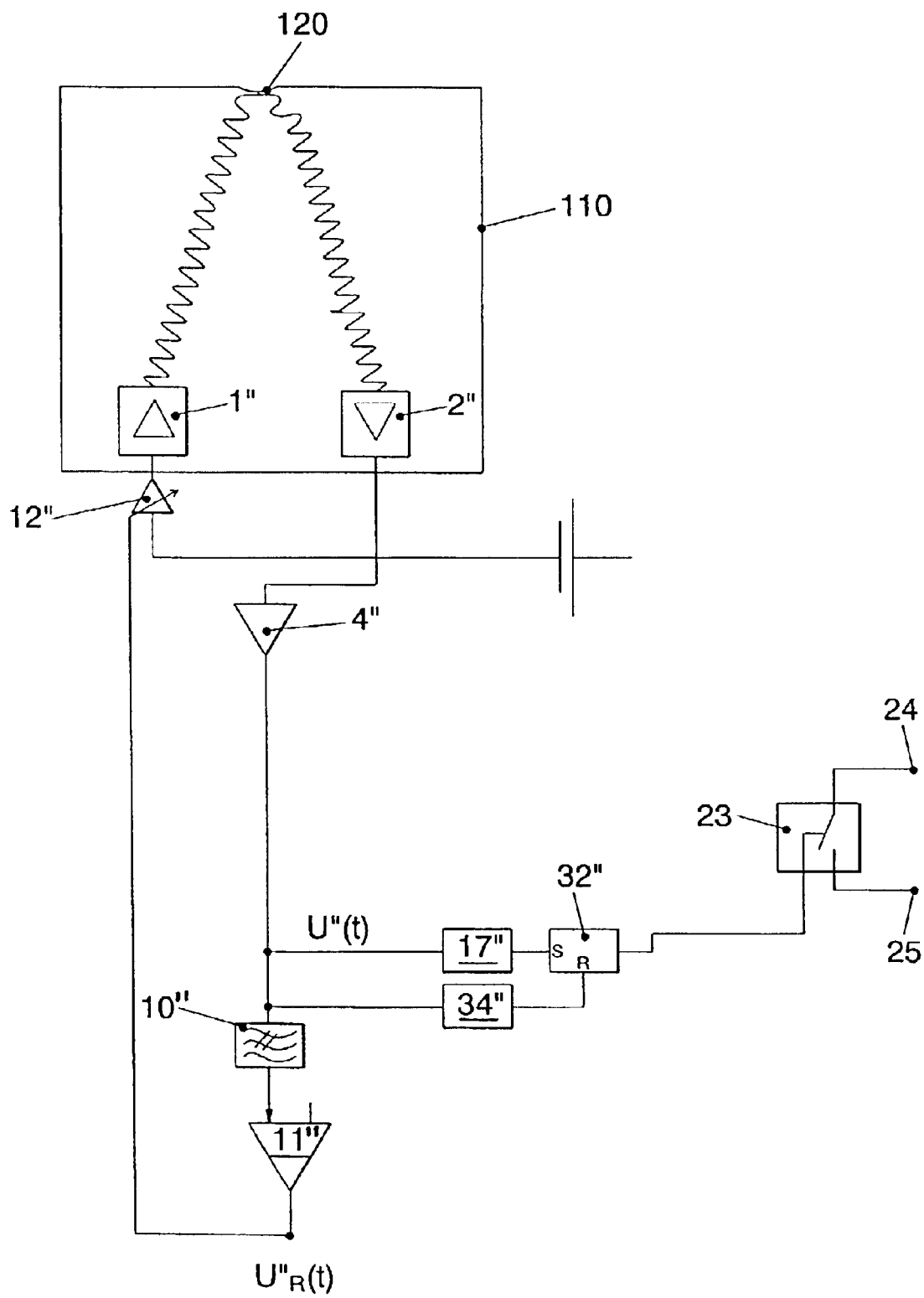
FIG. 7a is a third exemplified embodiment of an opto-electronic switch.

A third exemplified embodiment is represented in FIG. 7a. In this case there is no need for external light compensation and a single continuously operated light-emitting diode 1" serves as the light source. Light-emitting diode 1" and photodiode 2" are located in a box 110, which is opaque for the wavelength in which the photodiode 2" is sensitive, on the cover of which box a displaceable element, for example a spring lock washer 120, is disposed. The manually actuatable snap-type spring lock washer 120—shown in FIGS. 7a and 7b in the compressed state—reflects the light of the light-emitting diode 1" at least partially in the direction of the photodiode 2". By actuating the snap-type washer 120, its reflection characteristics with reference to the light emitted by the light-emitting diode 1" are changed, such that the amount of light, which contacts the photodiode, is dependent on the position of the snap-type washer.

The signal output by the light-emitting diode is amplified by the amplifier 4", at the output of which amplifier is situated the useful signal with the value U"(t). The useful signal is supplied to the signal centering level 11" via the low-pass filter 10". The signal centering level 11" controls the regulator 12", which regulates the voltage supply to the light-emitting diode, in such a manner that the useful signal is always regulated back to a predetermined signal level $U"_0$. By the signal centering level 11" being connected upstream of the low-pass filter 10", there is a certain time delay in the re-regulating of U"(t) to $U"_0$.

Figure 8A:
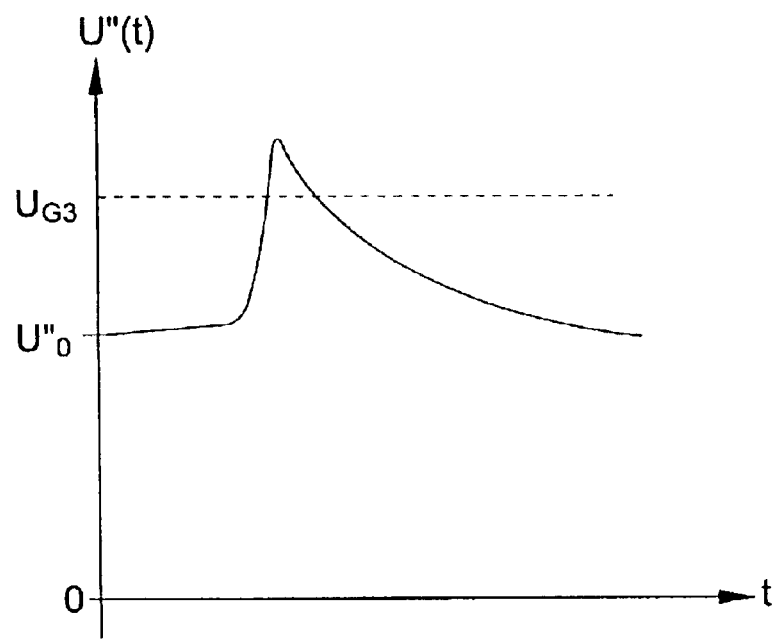
Figure 8B:
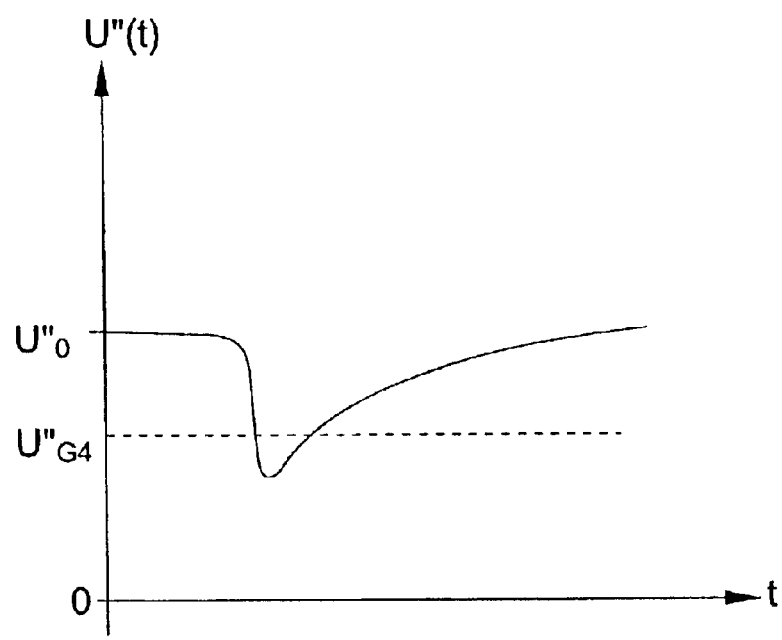

When the snap-type washer 120 is actuated, the amount of light received by the photodiode 2" changes, as does also, consequently, the value U"(t) of the useful signal, which is subsequently re-regulated back to $U"_0$. FIG. 8a shows a typical curve of U"(t) when the snap-type washer 120 is pressed down and FIG. 8b shows a typical curve when the snap-type washer 120 is released.

As there is no need to differentiate in this case between deliberate and accidental displacements, contrary to the previous exemplified embodiments—pushing through the snap-type washer 120 is always to be regarded as a deliberate action—the evaluation of the useful signal is very simple: If U"(t) exceeds the third threshold value $U_{G3}$, the output of the third threshold value switch 17" is set to active, as is consequently also the flip-flop 32". If the fourth threshold value $U_{G4}$ is exceeded, the output of the fourth threshold value switch 34" is set to active, and, consequently, the flip-flop 32" is reset.

The use of a snap-type washer or a similar component as the optically effective element has the advantage that the recognition of a desired switch actuation by way of a useful signal is very simple. The installation in a closed box at the same time serves as means for differentiating between the deliberate and the accidental displacement processes. This type of component can naturally also be used in an arrangement for external light compensation, as is described in exemplified embodiment 1. An opaque box can then be dispensed with.

Figure 7B:
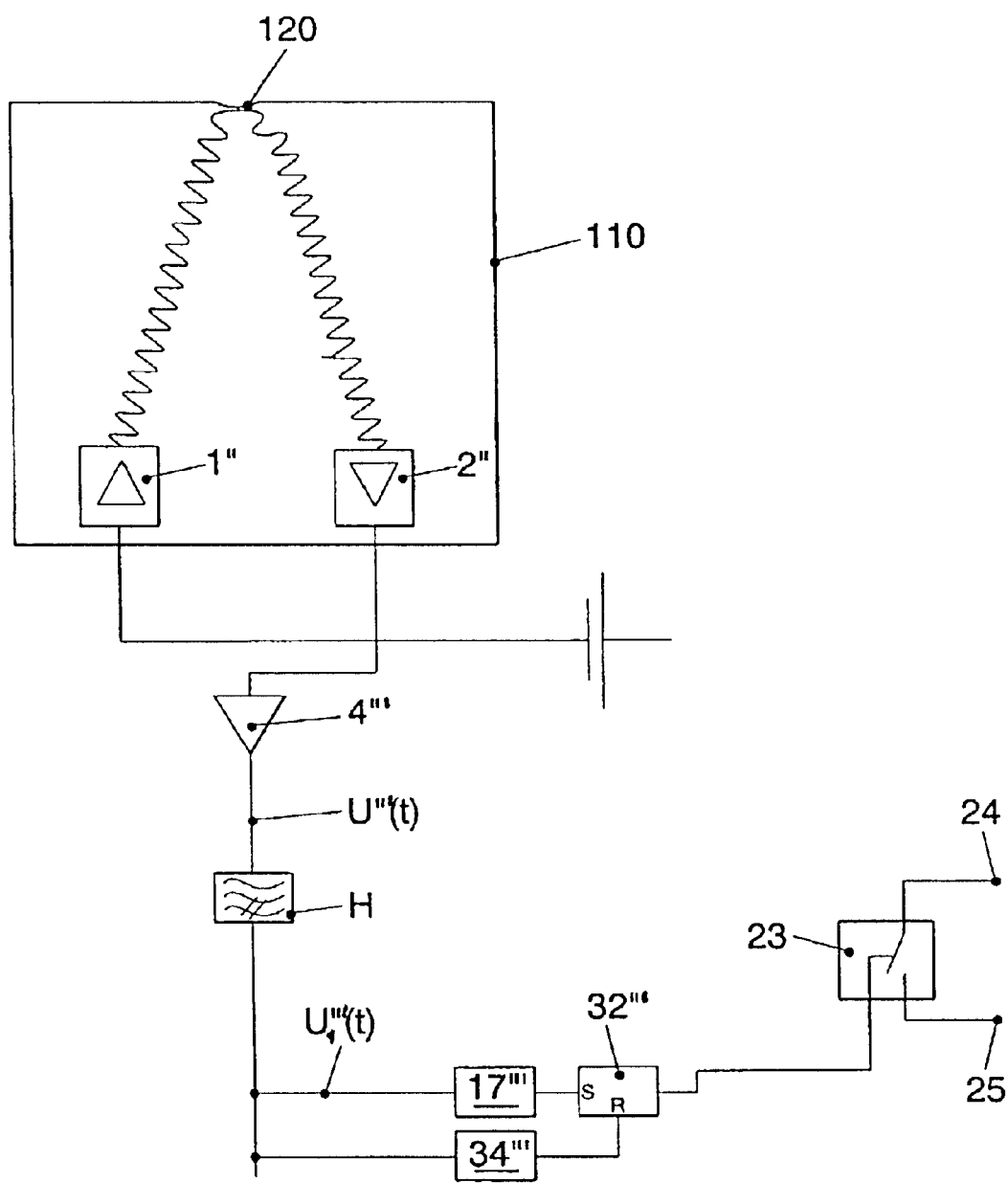
FIG. 7b is a variation on the exemplified embodiment shown in FIG. 7a, FIG. 8 are signal curves of U"(t) (exemplified embodiment 3)

A variant on this third exemplified embodiment is shown in FIG. 7b. There is no regulating of the light-emitting diode 1" in this case. The voltage signal output by the photodiode is amplified with the amplifier 4''', at the output of which amplifier is located the useful signal U'''(t). This useful signal U'''(t) is subject, where applicable, to time-slow oscillations through changes in temperature, ageing and similar. This useful signal U'''(t) is supplied to the high-pass filter H. The time-slow changes of the useful signal U'''(t) are filtered out by this high-pass filter H, such that the displacement signal $U_1'''(t)$, located at the output of the high-pass filter H, is always zero, as long as the snap-type washer 120 is idle. If the useful signal U'''(t) changes on account of a displacement of the snap-type washer 120, short pulses as a time-variable change in displacement occur quickly in the course of the displacement signal $U_1'''(t)$, for example a positive pulse when the snap-type washer is pushed through, a negative pulse when it is released. These pulses are recognized by the threshold value switches 17''' and 34''' and the flip-flop 32''' is correspondingly set or respectively reset (see above).

Fourth Exemplified Embodiment

In the previous examples, the optically effective element is disposed in the relative vicinity of the light emitting diode or light-emitting diodes and the photodiode. Another arrangement is now put forward, with which a greater degree of flexibility can be obtained.

Figure 9:
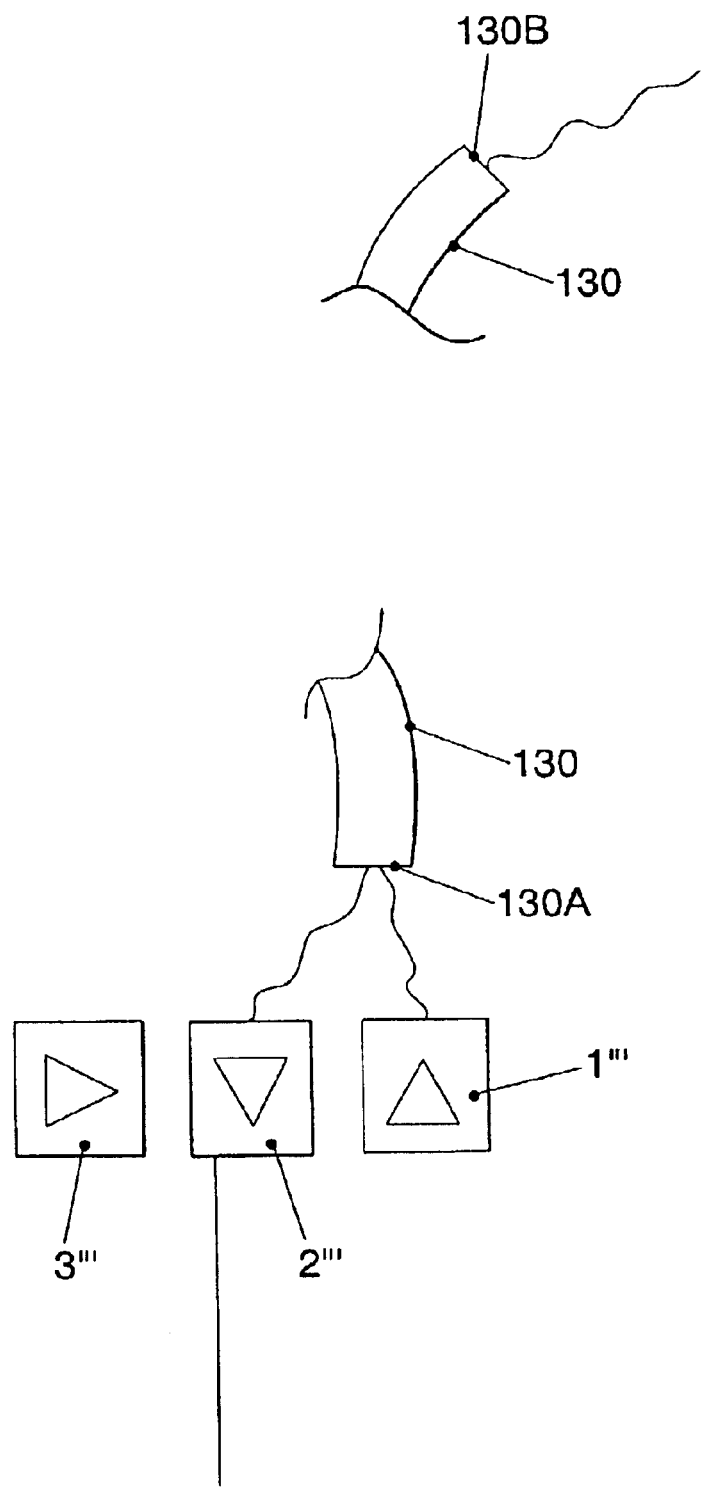
FIG. 9 is an exemplified embodiment with a photoconductor.

For this purpose, a photoconductor 130, for example a glass fiber, is disposed in such a manner that a light emitted from the light-emitting diode 1''' penetrates at least partially into the photoconductor and spreads out in the same and is passed on (FIG. 9). A portion of the light reflected at the second boundary surface 130B falls onto the photodiode 2'''.

As long as the second boundary surface 130B of the photoconductor 130 is free, almost all the light reaching the photoconductor re-emerges. This is changed drastically when an object is placed on this second boundary surface, more especially when this object has a higher optical density than the photoconductor. In this case, a considerable portion of the light is reflected on the boundary surface or is diffused back into the photoconductor and emerges again from the first boundary surface 130A and consequently increases the amount of light contacting the photodiode. Even the small amount of light diffused back into the "receiving" photoconductor is sufficient for signal recognition. Tests have produced values of 2–3% of the light emitted as light that has been diffused back, this being dependent, however, on the thickness of the photoconductor. The change in signal occurring at the same time can then be evaluated according to the arrangements mentioned above, such that, for example, a tapping of the second surface 130B of the photoconductor can be recognized. Compensation for external light can naturally also be executed as in the first exemplified embodiment.

Embodiments of the Light-emitting Diode Arrangements

FIGS. 10 and 11 show light-emitting diodes/photodiode arrangements, where only one sensor-active region is to be created. To this end, FIG. 10 uses a light-emitting diode 140 with light output beamed in the forward direction, such as, for example, a laser diode, and a "normal" light-emitting diode 145 with preferably spherical radiation characteristics. The spacing to the glass plate 31 is such that an object situated above the glass plate, for example a finger, can only interact with the radiation field of the light-emitting diode 140 with the beamed light output, as the radiation field of the "normal" light-emitting diode 145 is not far-reaching enough. Light-emitting diode 145, therefore, is only for compensating external light. A barrier 150 can also be mounted between light-emitting diode 140 with beamed light output and photodiode 2.

In the arrangement shown in FIG. 11, interaction between an actuating object, for example a finger, and the radiation field of the light-emitting diode 3 is obtained through shading by means of a reflector 160.

The arrangement shown in FIG. 11 is particularly well suited for operation without a transmission element, that is without a glass/plexiglass disc, glass fiber cable or similar. The sensor-active region in this case is situated above the photodiode 1. A corresponding evaluation unit could, for example, be designed such that a rapid approximation of a finger is interpreted as deliberate switching. However, there are also other arrangements, which can also be operated without a transmission element.

An example of an application for an opto-electronic switch according to the invention without using a transmission element could, for example, be the recognition of the removal from a corresponding telephone cradle of a telephone receiver and the placing back of a telephone receiver onto a corresponding telephone cradle.

It will be appreciated by one skilled in the art that this description can be subject to the most varied modifications, changes and adaptations, which range in the region of equivalents to the attached claims.

What is claimed is:

1. Opto-electronic switch comprising:
   at least one light-emitting transmitting element having a radiation field;
   at least one receiving element for receiving light, the at least one receiving element outputting a first signal, a value of the first signal depending on an amount of light received, wherein the at least one light-emitting transmitting element and the at least one receiving element are disposed so that the light transmitted by the at least one light-emitting transmitting element is at least partially reflected by an object which is situated within a given region and which is spaced in a given manner from the at least one receiving element and transmitting element such that at least an amount of a reflected light reaches the at least one receiving element; and
   an evaluation unit for evaluating the first signal and including at least one switching element, wherein the evaluation unit determines a rate of change in displacement of the object when the object is suddenly braked in a defined region, the time-rate of change in displacement being a function of a change in the first signal, which charge is caused by displacement of the object, the ovaluation unit recognizing the displacement as tapping when the displacement is within a predetermined displacement pattern, and wherein the switching element changes from one switching state to another switching state if the displacement of the object creates an object displacement pattern lying within limits of the predetermined displacement pattern.

2. Device according to claim 1, wherein the predetermined pattern includes a tapping of an operator interface of the opto-electronic switch, a dwelling of the object for a predetermined dwell time, and a raising of the object by more than a predetermined spacing.

3. Device according to claim 1, wherein the at least one light-emitting transmitting element and the at least one receiving element together comprise at least one sensor unit which supplies signals for detecting the object pattern.

4. Device according to claim 3, wherein the object displacement pattern is detected solely by the at least one sensor unit.

5. Device according to claim 3, wherein the at least one sensor unit alone supplies the signals for the evaluation unit for determining if the object pattern lies within the limits of the predetermined pattern.

6. Device according to claim 1, further comprising a transmission element transparent to at least one portion of the light emitted by the transmitting element, the transmission element being disposed in the radiation field of at least one of the at least one light-emitting transmitting element.

7. Device according to claim 6, wherein the transmission element comprises a glass pane.

8. Device according to claim 6, wherein the transmission element comprises a plexiglass pane.

9. Device according to claim 6, wherein the predetermined pattern includes a tapping of a defined region of the transmission element.

10. Device according to claim 6, wherein the transmission element includes a photoconductor having one boundary surface disposed in the radiation field of the transmitting element.

11. Device according to claim 10, wherein the photoconductor includes a second boundary surface, and the predetermined pattern comprises a tapping in a region of the second boundary surface of the photoconductor.

12. Device according the claim 1, further comprising a photoconductor arranged for supplying the reflected light to the receiving element.

13. Device according to claim 6, further comprising first and second sensor-active regions created on the transmission element by each of the at least one transmitting element.

14. Device according to claim 13, wherein one receiving element is assigned to each transmitting element, and wherein these receiving elements are connected electrically in parallel.

15. Opto-electronic switch comprising:
   at least one light-emitting transmitting element having a radiation field;
   at least one receiving element for receiving light, the at least one receiving element outputting a first signal, a value of the first signal depending on an amount of light received, wherein the at least one light-emitting transmitting element and the at least one receiving element are disposed so that light transmitted by the at least one light-emitting transmitting element is at least partially reflected by an object which is situated within a given region and which is spaced in a given manner from the at least one receiving element and transmitting element such that at least an amount of a reflected light reaches the at least one receiving element.
   an evaluation unit for evaluating the first signal and including at least one switching element, wherein the evaluation unit determines a time-variable change in displacement of the object when the object is suddenly braked in a defined region, the time-variable change in displacement being a function of a change in the first signal which change is caused by displacement of the object, the evaluation unit recognizing the time-variable displacement as tapping when the time-variable displacement is within a predetermined displacement pattern, and wherein the switching element changes from one switching state to another switching state if the displacement of the object creates an object displacement pattern lying within limits of the predetermined displacement pattern; and
   a transmission element transparent to at least one portion of the light emitted by the transmitting element, the transmission element being disposed in the radiation field of at least one of the at least one light-emitting transmitting element, wherein the transmission element includes a photoconductor having one boundary surface disposed in the radiation field of the transmitting element, wherein the photoconductor comprises a glass fiber.

16. Opto-electronic switch comprising:
   at least one light-emitting transmitting element having a radiation field;
   at least one receiving element for receiving light, the at least one receiving element outputting a first signal, a value of the first signal depending on an amount of light received, wherein the at least one light-emitting transmitting element and the at least one receiving element are disposed so that light transmitted by the at least one light-emitting transmitting element is at least partially reflected by an object which is situated within a given region and which is spaced in a given manner from the at least one receiving element and transmitting element such that at least an amount of a reflected light reaches the at least one receiving element;
   an evaluation unit for evaluating the first signal and including at least one switching element, wherein the evaluation unit determines a time-variable change in displacement of the object when the object is suddenly braked in a defined region, the time-variable change in displacement being a function of a change in the first signal, which change is caused by displacement of the object, the evaluation unit recognizing the time-variable displacement as tapping when the time-variable displacement is within a predetermined displacement pattern and wherein the switching element changes from one switching state to another switching state if the displacement of the object creates an object displacement pattern lying within limits of the predetermined displacement pattern, and
   a means for presenting a restoring force, and wherein the object comprises a displaceable element displaceable against the restoring force.

17. Device according to claim 16, wherein the displaceable element has an idle position which is pushed through during displacement against the restoring force.

18. Device according to claim 16, wherein the displaceable element comprises a snap-type washer.

19. Device according to claim 17, wherein the object pattern produced by the tapping comprises the pushing of the displaceable element through the idle position.

20. Opto-electronic switch comprising:
   at least one light-emitting transmitting element having a radiation field;
   at least one receiving element for receiving light, the at least one receiving element outputting a first signal, a value of the first signal depending on an amount of light received, wherein the at least one light-emitting transmitting element and the at least one receiving element are disposed so that light transmitted by the at least one light-emitting transmitting element is at least partially reflected by an object which is situated within a given region and which is spaced in a given manner from the at least one receiving element and transmitting element such that at least an amount of a reflected light reaches the at least one receiving element;
   an evaluation unit for evaluating the first signal and including at least one switching element, wherein the evaluation unit determines a time-variable change in displacement of the object when the object is suddenly braked in a defined region, the time-variable change in displacement being a function of a change in the first signal, which change is caused by displacement of the object, the evaluation unit recognizing the time-variable displacement as tapping when the time-variable displacement is within a predetermined displacement pattern, and wherein the switching element changes from one switching state to another switching state if the displacement of the object creates an object displacement pattern living within limits of the predetermined displacement pattern;
   at least two transmitting elements which emit at least one of a set consisting of (a) light of the same wavelength and (b) light in the same wavelength range, the at least two transmitting elements operating in alternate cycles; and
   a circuit for external light compensation disposed downstream of the at least one receiving element.

21. Device according to claim 20, comprising:
   a first displaceable element situated in the radiation field of the first transmitting element; and a second displaceable element situated in the radiation field of the second transmitting element.

22. Device according to claim 21, wherein the first and second displaceable elements are displaceable against a restoring force.

23. Device according to claim 22, wherein at least one of the first displaceable element and the second displaceable element has an idle position which is pushed through during displacement against the restoring force.

24. Device according to claim 21, wherein at least one of the first displaceable element and the second displaceable element comprises a snap-type washer.

25. Device according to claim 20, wherein a displacement of the object only influences the light from one transmitting element.

* * * * *